United States Patent [19]

Hines

[11] Patent Number: 4,602,208

[45] Date of Patent: Jul. 22, 1986

[54] TEMPERATURE COMPENSATED CURRENT SWITCH

[75] Inventor: John R. Hines, Garland, Tex.

[73] Assignee: Texas Instruments Incorporated, Dallas, Tex.

[21] Appl. No.: 717,740

[22] Filed: Mar. 29, 1985

[51] Int. Cl.[4] .............................................. G05F 3/20
[52] U.S. Cl. ................................. 323/317; 323/907; 330/289
[58] Field of Search ............... 323/315, 316, 317, 907, 323/284, 351; 307/310, 350, 351, 494; 330/256, 257, 289

[56] References Cited

U.S. PATENT DOCUMENTS

| | | | |
|---|---|---|---|
| 4,400,635 | 8/1983 | Mazgy | 307/310 |
| 4,446,419 | 5/1984 | van de Plassche et al. | 323/316 |
| 4,506,176 | 3/1985 | Harris | 307/350 |
| 4,524,292 | 6/1985 | Nagano | 307/494 |
| 4,528,516 | 7/1985 | Hill | 330/256 |

OTHER PUBLICATIONS

Gilbert, Barrie, "*Translinear Circuits*", May, 1981.

*Primary Examiner*—Peter S. Wong
*Assistant Examiner*—Judson H. Jones
*Attorney, Agent, or Firm*—Richard A. Bachand; N. Rhys Merrett; Melvin Sharp

[57] ABSTRACT

A current switch whose turn-on and turn-off voltages are independent of temperature includes a transistor switch circuit having two input transistors to which a differential voltage is applied, two sensing transistors for sensing turn-on and turn-off voltages respectively, and an output transistor controlled by the sensing transistors. A differential voltage sensing circuit including a differential transistor pair is connected to receive the differential voltage at the inputs of the transistors and to deliver the differential voltage to the transistor switch circuit. A biasing current source is provided to supply biasing currents which vary as a function of temperature to the input and sensing transistors of the switch circuit, and a biasing current source is provided to supply a biasing current which varies as a function of temperature squared to the differential transistor pair.

8 Claims, 1 Drawing Figure

TEMPERATURE COMPENSATED CURRENT SWITCH

BACKGROUND OF THE INVENTION

1. Field of the Invention

This invention relates to temperature compensated circuits, and more particularly, to improvements in temperature compensated bipolar transistor switch circuits.

2. Description of the Related Art

In the past, it has been recognized that the switching voltage of typical bipolar switch circuits is dependent on temperature, and many efforts have been advanced to attempt to compensate for this circuit deficiency. It is generally recognized that switch circuits need to reliably turn on at a predictable input voltage. In addition, the effect of input voltage noise on turn-off and turn-on voltage levels must be minimized. Finally, the turn-off and turn-on voltages themselves must be temperature stable. These considerations are complicated when the input voltage is a differential voltage rather then a voltage reference, for example, to ground.

A typical switch of the prior art with which the invention may be applied is shown in FIG. 1, and denoted by the reference 10 within the dotted box. The switch is fabricated of bipolar devices including a pair of PNP input transistors 11 and 12. A pair of PNP sensing transistors 13 and 14 are connected to the respective emitters of input transistors 11 and 12, a resistor 16 being provided between the base of the sensing transistor 14 and the emitter of the input transistor 12 to provide a voltage turn-on/turn-off hysteresis. An output transistor 18 is connected with its base attached to the collector of the sensing transistor 14 and the emitter of sensing transistor 13. The output current of the switch is derived in the series circuit including a collector and emitter of the output transistor 18. A current bias source 20 is provided in the circuit including the emitter and collector of the sensing transistor 14, as shown. (The current value $I_{KTQ}/2$ shown outside the dotted box is not a part of the prior art switch circuit, as will be become apparent from the description below.) In the prior art circuit the biasing currents provided on lines 22, 23 and 24 were essentially temperature independent, that is, had zero variation with respect to variations in the temperature of the circuit. Temperature compensation was accomplished by appropriate biasing of a differential pair of transistors, similar to those shown in the differential pair circuit 40 to which a differential voltage input was applied, as shown. The differential pair includes two transistors, 42 and 43 to the respective bases of which the differential input voltage is applied. The emitters of the transistors 42 and 43 are connected together, and the collectors have respective identical resistors $R_g$ connected between the collectors and ground. The output from the differential pair is derived at the collectors of the transistors 42 and 43, to which base connections are made to the respective input transistors 11 and 12 of the switch 10. In efforts to compensate the switch circuit 10 for variations in ambient temperature, a bias current was applied to the emitters of the differential pair transistors 42 and 43 which varied as a first order function of temperature. In the prior art, it has been considered more desirable to utilize a temperature proportional current to bias the differential pair as opposed to a zero temperature coefficient biasing current since using a zero temperature coefficient bias current, the gain of the differential pair decreases as temperature increases. Nevertheless, using the aforementioned temperature proportional current results in the gain being constant over temperature, but the result is still not ideal.

SUMMARY OF THE INVENTION

In light of the above, it is, therefor, an object of the invention to provide a temperature compensated switch of bipolar transistors.

It is another object of the invention to provide a temperature compensated switch of the type described which additionally has sufficient turn-on/turn-off hysteresis for practical operation.

It is still another object of the invention to provide a switch circuit which has a dependable turn-on voltage relatively independently of input voltage noise at a predictable input voltage and in which the turn-on and turn-off voltages are temperature stable.

The invention, in its broad aspect, presents a temperature compensated switch circuit formed of bipolar transistors and having a differential transistor pair driving the input of the switch. A biasing current is provided to the differential pair which varies as a function of temperature squared. In addition, biasing currents are provided to the temperature switch itself which are functions of temperature.

Thus, in accordance with a broad aspect of the invention, a current switch is provided whose turn-on and turn-off voltages are independent of temperature which includes a transistor switch circuit having two input transistors to which a differential voltage is applied, two sensing transistors for sensing turn-on and turn-off voltages respectively, and an output transistor controlled by the sensing transistors. A differential voltage sensing circuit including a differential transistor pair is connected to receive the differential voltage at the inputs of the transistors and to deliver the differential voltage to the transistor switch circuit. A biasing current source is provided to supply biasing currents which vary as a function of temperature to the input and sensing transistors of the switch circuit, and a biasing current source is provided to supply a biasing current which varies as a function of temperature squared to the differential transistor pair.

In accordance with another broad aspect of the invention, a differential amplifier circuit is presented for providing a differential voltage output which varies as a function of temperature from a differential input voltage. The differential amplifier circuit includes a differential voltage amplifier circuit comprising a differential transistor pair connected to receive the differential input voltage at their inputs and to deliver a differential voltage at their outputs. Additionally, means are provided for supplying a biasing current to said differential transistor pair which varies as at least a second order function of temperature. In a preferred embodiment, the differential amplifier supplies a biasing current which varies as a function of temperature squared.

BRIEF DESCRIPTION OF THE DRAWING

The invention as illustrated in the accompanying drawing, in which.

DETAILED DESCRIPTION OF THE PREFERRED EMBODIMENTS

Figure 1:
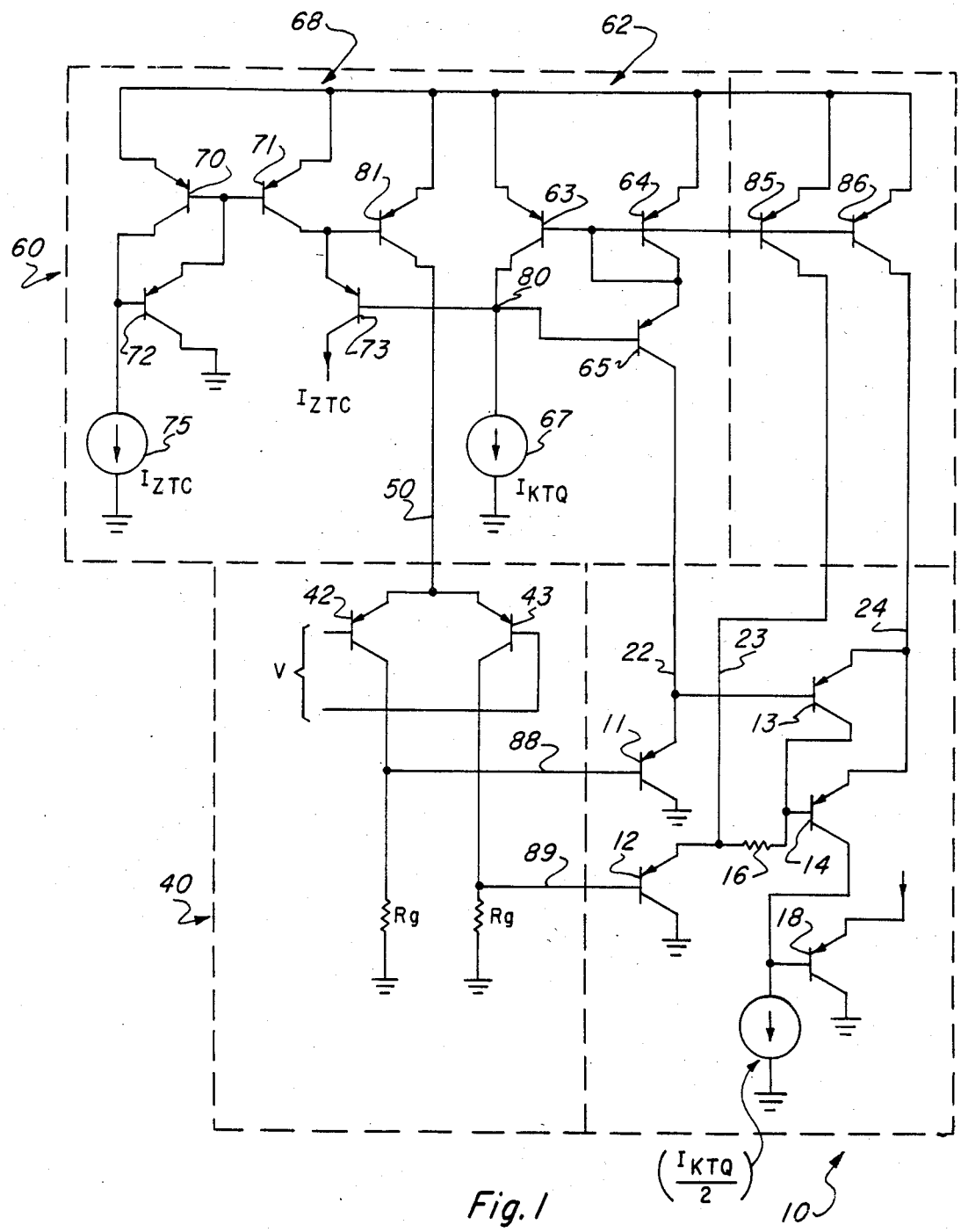
FIG. 1, the sole FIGURE, is a schematic diagram of a temperature compensated current switch with hysteresis, in accordance with the invention.

In accordance with the invention, a switch circuit 10 is provided, driven by standard differential amplifier 40, both as above described. In accordance with the invention, biasing currents are provided on lines 22, 23 and 24, which are temperature dependent, or, stated another way, provided as a function of temperature. Additionally, provided to the differential amplifier 40 on line 50, in accordance with the invention, is a current which is proportional to temperature squared. The current which is proportional to temperature squared provided on line 50 is generated by a multiple temperature coefficient current mirror circuit 60, to be presently described. The switch circuit 10 itself includes a source 20 of biasing current which varies as a first order function of temperature, for example, $I_{KTQ}/2$.

The multiple temperature coefficient current mirror 60 includes a standard Wilson current mirror, generally denoted by the reference numeral 62. The Wilson current mirror 62 includes three transistors, 63, 64 and 65, connected in a manner known in the art. More specifically, transistors 64 and 65 are connected with their emitters and collectors in a series of path to provide on line 22 at the collector output of transistor 65, a current which is proportional to temperature. The collector of transistor 63 is connected to the bases of transistors 63 and 64, which are, in turn, connected together. The collector and emitter of transistor 63 is connected in series with a current source 67, which is a current source which provides a current proportional to temperature, such current sources being well known in the art.

On the other hand, a non-standard mirror circuit 68 is provided, and includes four transistors 70, 71, 72 and 73. The emitter and collector of transistor 70 are connected in series with a source of current 75 which has zero temperature coefficient. Transistor 71 and 73 are connected with their emitters and collectors in a series circuit to provide at the collector output of transistor 73 a current which has zero temperature coefficient. The bases of transistors 70 and 71 are connected together, and to the emitter of transistor 72. The collector of transistor 72 is connected to ground to provide a series path between the bases of transistors 70 and 71 and ground. The base of transistor 72 is connected between the collector of transistor 70 and the source 75 of zero temperature coefficient current. The base of the transistor 73 is connected to node 80, which, enable the currents in the circuit to be multiplied, as below described. Current sources such as current source 75 of zero temperature compensation are known in the art.

A transistor 81 is provided having its emitter and collector connected in a series path to provide on the output line 50 a current which is proportional to temperature squared. The base of the transistor 81 is connected to the collector of the transistor 71 or emitter of transistor 73.

In addition to the foregoing, two transistors 85 and 86 are provided in conjunction with the Wilson mirror 62 to each provide a source of bias current to the switch 10 on respective lines 23 and 24, the bias currents being a function of temperature in a fashion similar to that developed on line 22 as described above.

Thus, in operation, the combination of the multiple temperature coefficient current mirror 60 and the differential voltage amplifier 40 provides on lines 88 and 89 a voltage which varies as a function of temperature. It should be noted that the voltage amplifier thus constituted, biased in the manner shown, can be used in other applications in addition to driving the current switch 10. For example, current switch 10 could be replaced by an amplifier circuit or any other circuit which requires a temperature varying voltage input.

As will appreciated by those skilled in the art, in the past, the provision of a biasing current to the differential amplifier 40 which varies merely as a first order function of temperature will provide on the output lines 88 and 89 a voltage which is, in essence, temperature independent. Efforts have been made in the past to provide a temperature variation function of the output from such differential amplifier 40, This has been achieved primarily by providing a voltage at the input to a differential amplifier which varies as a function of temperature. If the input is independent of temperature, often, the resistors $R_g$ are made to be temperature dependent, in relatively complicated fashion, as known in the art.

By the provision of the multiple temperature coefficient circuit mirror 68, a current which is proportional to the second order of temperature or temperature squared is provided on line 50. Thus, the gain of the amplifier 40 provides at the output on lines 88 and 89 a signal which varies as a function of temperature, without additional complicated or expensive biasing means.

One feature of the circuit which deserves special mention is the provision of node 80 in the mirror circuit at the interconnection of the bases of transistors 65 and 73 and between the collector of transistor 63 and the first order temperature varying current source 67. By virtue of the node 80, the currents in the various series emitter collector paths are multiplied to accomplish the output current on line 50 which varies as a second order function of temperature. It should be noted that in a preferred embodiment, the output current derived on the collector of transistor 73 is a zero temperature coefficient current which can be used, for example, to bias a Hall effect device, such devices being well known in the art, and are not described herein in detail.

It should also be noted that by the adjustment of the arrangement of biasing current sources 67 and 75, other temperature varying functions can be accomplished. Thus, for example, by switching or substituting the current sources 67 and 75 one for the other, an output characteristic upon the line 50 can be achieved which varies as a function of inverse temperature. Those skilled in the art will appreciate that by virtue of the possibility of achieving either an inverse temperature, first order or second order temperature varying current, practically any polynomial biasing current characteristic can be accomplished by appropriate manipulation of current sources in the circuit.

Although the invention has been described and illustrated with a certain degree of particularity, it is understood that the present disclosure has been made by way of example only and that numerous changes in the combination and arrangement of parts may resorted to by those skilled in the art without departing from the spirit and the scope of the invention is hereinafter claimed.

What is claimed is:

1. A current switch whose turn-on and turn-off voltages are independent of temperature, comprising:
    a transistor switch circuit having two input transistors to which a differential voltage is applied, two sensing transistors for sensing turn-on and turn-off voltages respectively, and an output transistor controlled by said sensing transistors;

a differential voltage sensing circuit comprising a differential transistor pair, connected to receive the differential voltage at their inputs and to deliver a differential voltage at their outputs for delivery to said transistor switch circuit;

means for supplying a biasing current which varies as a function of temperature to said input and sensing transistors of said transistor switch circuit;

and means for supplying a biasing current which varies as a function of temperature squared to said differential transistor pair of said differential voltage sensing circuit.

2. In a current switch of the type having a transistor switch circuit including two input transistors to which a differential voltage is applied, two sensing transistors for sensing turn-on and turn-off voltages applied to said input transistors, and an output transistor controlled by said sensing transistors, and further having a differential voltage sensing circuit including a differential transistor pair, connected to receive the differential voltage at their respective inputs and to deliver a differential voltage at their outputs to said transistor switch circuit, the turn-on and turn-off voltages of said switch being independent of temperature, the improvement comprising:

means for supplying a biasing current which varies as a function of temperature to said input and sensing transistors of said transistor switch circuit;

and means for supplying a biasing current which varies as a function of temperature squared to said differential transistor pair of said differential voltage sensing circuit.

3. In a current switch of the type having a transistor switch circuit including two input transistors to which a differential sensing turn-on and turn-off voltages applied to said input transistors, and an output transistor controlled by said sensing transistors, and further having a differential voltage sensing circuit including a differential transistor pair, connected to receive the differential voltage at their respective inputs and to deliver a differential voltage at their outputs to said transistor switch circuit, the turn-on and turn-off voltages of said switch being independent of temperature, the improvement comprising:

means for supplying a biasing current which varies as a function of temperature to said input and sensing transistors of said transistor switch circuit, comprising:

a source of current which varies as a function of temperature;

a Wilson mirror circuit for generating a mirrored current of said current which varies as a function of temperature;

and means for supplying a biasing current which varies as a function of temperature squared to said differential transistor pair of said differential voltage sensing circuit, comprising:

a mirror circuit, including:

a temperature invariant source of current;

first and second pairs of transistors, each transistor having an emitter, base, and collector;

a first transistor of said first pair of transistors being connected with its emitter and collector in series with said source of current which is invariant with temperature, the other transistors of said first pair of transistors being connected with its emitter and collector in a series path between the base of said first transistor and ground, and with its base being connected to the collector of said first transistor, the first and other transistors of said second pair of transistors being connected with their emitters and collectors in a series path to form a current output path mirroring said source of current which is invariant with zero temperature, the base of said other transistor being connected to said source of current which varies as a function of temperature;

and a transistor having an emitter, base and collector, the emitter and base being respectively connected to the emitter and collector of said first transistor of said second pair of transistors, and an output current derived at the collector of said transistor being a current which varies as a function of temperature squared.

4. A circuit for generating a current which is a function of temperature squared, comprising:

a source of current which varies as a function of temperature;

a Wilson mirror circuit for generating a mirrored current of said current which varies as a function of temperature;

a mirror circuit, including:

a temperature invariant source of current;

first and second pairs of transistors, each transistor having an emitter, base, and collector;

a first transistor of said first pair of transistors being connected with its emitter and collector in series with said source of current which is invariant with temperature the other transistors of said first pair of transistors being connected with its emitter and collector in a series path between the base of said first transistor and ground, and with its base being connected to the collector of said first transistor, the first and other transistors of said second pair of transistors being connected with their emitters and collectors in a series path to form a current output path mirroring said source of current which is invariant with zero temperature, the base of said other transistor being connected to said source of current which varies as a function of temperature;

and a transistor having an emitter, base and collector, the emitter and base being respectively connected to the emitter and collector of said first transistor of said second pair of transistors, and an output current derived at the collector of said transistor being a current which varies as a function of temperature squared.

5. A circuit for generating a current which is a function of temperature squared, comprising:

a source of current which varies as a function of temperature;

a Wilson mirror circuit for generating a mirrored current of said current which varies as a function of temperature;

a mirror circuit, including:

a temperature invariant source of current;

first and second pairs of transistors, each transistor having an emitter, base, and collector;

a first transistor of said first pair of transistors being connected with its emitter and collector in series with said source of current which is invariant with temperature;

the other transistors of said first pair of transistors being connected with its emitter and collector in a series path between the base of said first transistor and ground, and with its base being connected to the collector of said first transistor, the first and other transistors of said second pair of transistors being connected with their emitters and collectors in a series path to form a current output path mirroring said source of current which is invariant with zero temperature, the base of said other transistor being connected to said source of current which varies as a function of temperature;

and a transistor having an emitter, base and collector, the emitter and base being respectively connected to the emitter and collector of said first transistor of said second pair of transistors, and an output current derived at the collector of said transistor being a current which varies as a function of temperature squared.

6. In a current switch of the type having a transistor switch circuit including two input transistors to which a differential voltage is applied, two sensing transistors for sensing turn-on and turn-off voltages applied to said input transistors, and an output transistor controlled by said sensing transistors, and further having a differential voltage sensing circuit including a differential transistor pair, connected to receive the differential voltage at their respective inputs and to deliver a differential voltage at their outputs to said transistor switch circuit, the turn-on and turn-off voltages of said switch being independent of temperature, the improvement comprising:

a Wilson mirror for generating a current which varies as a function of temperature for biasing said input and sensing transistors of said transistor switch circuit;

a mirror circuit for generating a current which is temperature invariant, and a current multiplying circuit for generating a current from said temperature invariant current generate by said mirror circuit and from said circuit which varies as a function of temperature generated by said Wilson mirror which varies as a function of temperature squared for biasing said differential transistor pair.

7. A differential amplifier circuit for providing a differential voltage output which varies as a function of temperature from a differential input voltage, comprising:

a differential voltage amplifier circuit comprising a differential transistor pair, connected to receive the differential input voltage at their inputs and to deliver a differential voltage at their outputs; and means for supplying a biasing current to said differential transistor pair which varies as at least a second order function of temperature.

8. The differential amplifier of claim 7 in which the biasing current supplying means supplied a biasing current which varies as a function of temperature squared.

* * * * *